(12) United States Patent
Ufert

(10) Patent No.: US 7,265,381 B2
(45) Date of Patent: Sep. 4, 2007

(54) OPTO-ELECTRONIC MEMORY ELEMENT ON THE BASIS OF ORGANIC METALLOPORPHYRIN MOLECULES

(75) Inventor: Klaus Ufert, Unterschleissheim (DE)

(73) Assignee: Infineon Technologies, AG, Neubiberg (DE)

( * ) Notice: Subject to any disclaimer, the term of this patent is extended or adjusted under 35 U.S.C. 154(b) by 148 days.

(21) Appl. No.: 11/024,932

(22) Filed: Dec. 30, 2004

(65) Prior Publication Data

US 2006/0145181 A1   Jul. 6, 2006

(51) Int. Cl.
*H01L 29/10* (2006.01)

(52) U.S. Cl. .................. 257/43; 438/104; 257/448; 257/E21.645

(58) Field of Classification Search .................. 257/43, 257/448, E21.645; 438/104
See application file for complete search history.

(56) References Cited

U.S. PATENT DOCUMENTS 5,117,477 A * 5/1992 Satoh ........................ 385/88
5,327,373 A * 7/1994 Liu et al. ................. 365/112
5,475,213 A * 12/1995 Fujii et al. ............ 250/214 LA
6,727,522 B1 * 4/2004 Kawasaki et al. .......... 257/103
6,888,750 B2 * 5/2005 Walker et al. ......... 365/185.05

FOREIGN PATENT DOCUMENTS

WO   WO-2005053027 A1 *  6/2005

* cited by examiner

*Primary Examiner*—Richard A. Booth
(74) *Attorney, Agent, or Firm*—Edell, Shapiro & Finnan, LLC

(57) ABSTRACT

A memory cell for opto-electronic applications includes a substrate, a first electrode and a second electrode, and an active layer arranged between the first and the second electrodes, wherein the active layer includes a metalloporphyrin derivative, and wherein the second electrode is transparent and includes ZnO, which is doped with B, Al, Ga, or Mg.

14 Claims, 1 Drawing Sheet

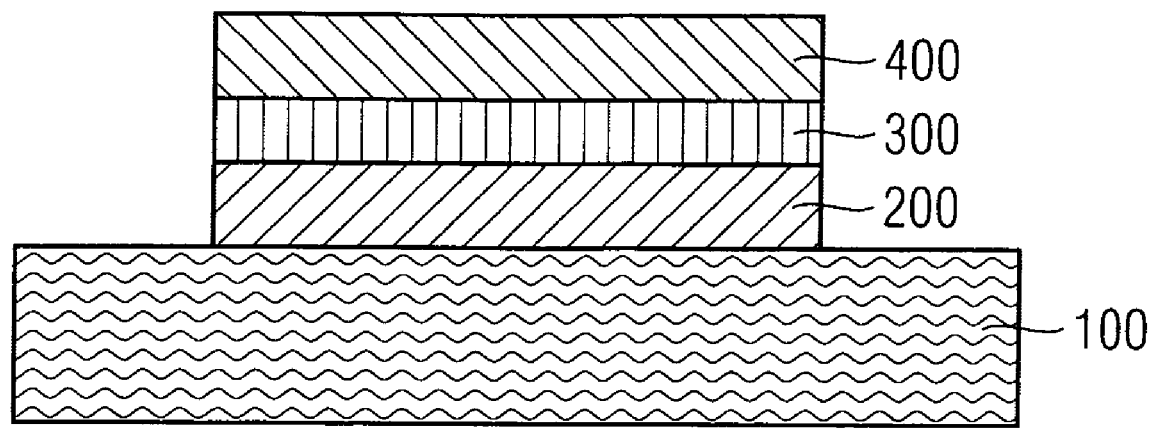

OPTO-ELECTRONIC MEMORY ELEMENT ON THE BASIS OF ORGANIC METALLOPORPHYRIN MOLECULES

FIELD OF THE INVENTION

The present invention relates to a method for fabricating opto-electronic digital memory cells and the memory cells produced by this method and, more particularly, to memory cells comprising a layer of a self-assembled mono layer.

BACKGROUND OF THE INVENTION

Opto-electronic digital memory cells are characterized by thin film storage media (less than 10 µm thick), rapid response times, high charge storage density, virtually unlimited information storage times, and low operating voltages (0.5 to 10 V).

There are approaches to use optoelectronic elements on a flexible substrate, e.g., on a polymer layer, with organic metalloporphyrins (e.g. ZnODEP) in the form of a self-assembled mono layer as active layer. Memory cells known up to now and based on the Zn-porphyrine complexes comprise a transparent top electrode. The most common transparent electrode is made up of a so-called InSnO-Indium Tin Oxide material (ITO), since this material has high electrical conductivity. The manufacturing of a top electrode made up of an ITO material, has usually been done by deposited the material by the way of sputtering the ITO targets on the active layer.

Some memory cells, which are related to the present invention, are described in C. Li, H. Pan, A. J. Bard, M. A. Fox, U.S. Pat. No. 5,327,373,and C. Li, A. J. Bard, Acc Chem. Res. Vol. 32,(1999), p. 235. The above-mentioned documents are incorporated by reference.

The sputtered atoms In, Sn and O have considerable kinetic energies which enable a certain number of atoms to penetrate molecular self-assembled monolayers, where they can be incorporated directly or after several relaxation processes into the organic porphyrin molecule of the active layer. While the incorporation of oxygen onto the borders of the pyroll rings of the ZnODEP molecule results in only minor disruptions, the incorporation or the chemical arranging of In or Sn atoms means a disruption of the memory effect in the Zn-porphyrin molecule. If indium or tin replaces the Zn-cation at the centrally functional place of the memory molecule, then the memory function of such a cell is destroyed, since the memory effect of the Zn-porphyrine based redox center has been disrupted.

SUMMARY OF THE INVENTION

The present invention relates to a method for fabricating opto-electronic digital memory cells and the memory cells produced by this method and especially to digital memory cells based on a self-assembled monolayer of a Zn-porphyrin derivative.

Storage media in the present invention include Zn-complexes of octaalkylether derivatives of octakis (β-hydroxyethyl) porphyrins. The latter compounds were developed for possible applications in photovoltaic devices and have also shown interesting optoelectric properties, especially useful in thin film memory cells.

According to the invention a memory cell is provided for optoelectronic applications wherein the cell comprises: a substrate; a first electrode and a second electrode; an active layer disposed between the first and the second electrode, wherein the active layer is made up of a Zn-porphyrin derivative(s). The second electrode is transparent and is made up of ZnO, which is doped with one of the elements selected from the group consisting of boron, aluminum, gallium, and magnesium.

According to the invention, the transparent top contact layer is made up of ZnO, which is doped with one of the elements selected from the group consisting of boron, aluminum, gallium, and magnesium.

An appropriate doping concentration lies in the region of about 0.5 to about 5 Atom % whereby the range of about 1 to about 2.5 Atom % is particularly favored. The most preferred dopant concentration is in the range of 1-1.5 Atom %.

The electrical conductivity of such a layer is comparable to the electrical conductivity of ITO but has the advantage that it contains only Zn- and O-atoms, wherein the dopant concentration is negligible. The incorporation of Zn or oxygen, which form the top electrode, into the active layer of metalloporphyrin molecules does not cause any functional disruptions.

Zinc is located in the central position of the porphyrin molecule so that during the formation of the top contact one zinc atom used to form the top contact would replace the Zn atom situated in central position of the porphyrin molecule. The Zn-porphyrin molecule remains unchanged.

If there is a defect in the metalloporphyrin layer and no Zn atom is present in the porphyrin molecule, a Zn atom used to form the top contact would fill an empty space in the center of the porphyrin molecule which would lead to the improvement of the active layer.

The dopants which could be present in the ZnO layer, if it is necessary, do not play a decisive role with regard to the memory properties of the Zn-porphyrine derivative due to their small concentration.

According to the present invention, damages to the molecular electro-active mono layer can be, thus, deliberately avoided.

BRIEF DESCRIPTION OF THE DRAWINGS

Various objects, specific features, and advantages of the present invention are symbolically depicted in the following drawing, serving as a basis for the detailed description of the invention.

The drawings are presented for the purpose of illustration only and is not intended to be limiting to the scope of the invention, in which:

FIG. 1 depicts a schematic cross section of a molecular memory cell on the basis of a self-assembled mono layer made of a Zn-porphyrin derivative, and is disposed between a bottom and a top electrode.

DETAILED DESCRIPTION OF THE INVENTION

The depicted structure in FIG. 1 corresponds to a memory cell according to the invention. On a substrate, which is a flexible substrate 100 comprising a polymer layer for instance, a first electrode 200 is deposited and structured. First electrode 200 comprises a material on which the appropriate porphyrin derivatives form a self-assembled mono layer. If, for instance, the porphyrin molecule comprises thiol groups, then first electrode 200 is made of a material selected from the group consisting of, for example, Au, Ag, Pt, and Pd. If the porphyrin molecule comprises silane or phosphonic acid groups, then first electrode 200 is made of silicon/silicon oxide layers.

The self-assembled mono layer which has been formed on the first electrode, represents the active layer 300. On this active layer 300, a transparent second electrode 400 made up of ZnO is formed.

According to the invention, the memory cell for the optoelectronic application is made of a substrate 100 which shows preferably considerable flexibility. Very thin silicon substrates, for instance, are suitable as such substrates. The disadvantage of silicon substrates, which are cut very thinly, lies in the fact that such substrates are very fragile. Consequently, according to the invention, substrates made up of polymer materials are preferred. Such substrates are known to those skilled in the art.

First electrode 200 is deposited and structured onto the preferably flexible substrate 100. The deposition and the structuring of the first electrode 200 can be carried out by common techniques (vapor deposition techniques, lithographic techniques). The principle requirement of the first electrode 200 is the capability to form thereon the self-assembled mono layer 300 of at least one porphyrin derivative. If, for instance, the first electrode 200 consists of a Si/SiO layer, a porphyrin derivative should contain such groups which are able to interact with the SiO surface, and which can result in a self-assembled mono layer. It must be noted that silicon oxide is described as SiO in order to cover all stoichiometric and non-stoichiometric characteristics of Si and oxygen and any further other inorganic elements (e.g. nitrogen) as well as organic residues.

When first electrode 200 is brought into contact with porphyrin molecules, a self-assembled mono layer of Zn-porphyrin derivative 300, which can also be called the "active layer," is formed on the surface of first electrode 200. The formation of the self-assembled monolayer of the Zn-porphyrin derivative 300 can be achieved, for example, by bringing the first electrode into contact with a solution of a metalo-porphyrin. The porphyrin layer can also be deposited from the gas phase. In this case, a complexation of the porphyrin core with a metal could become necessary. The procedures of self-assembled mono layers are known to those skilled in the art and described in, for instance, S. Gowda, G. Mathur, Q. Li, Q. Zhao, J. S. Lindsey, K. Mobley, D. F. Bocian, V. Misra, IEDM Conf., Washington D.C. (December 2003) p. 2211 or D. T. Gryko, C. Clausem, J. S. Lindsay, J. Org. Chem. vol. 64,(1999), p. 8635.The self-assembled mono layer is preferably selectively formed on the surface of first electrode 200 and not on substrate 100, making the structuring of the self-assembled mono layer superfluous.

The transparent second electrode 400 is then deposited on the self-assembled mono layer of porphyrin molecules 300. The deposition of the second electrode can be carried out by sputtering, CVD, ALD, PCVD or similar methods.

The preferred method for the deposition of the transparent second electrode is by MOCVD. In this procedure, the particles being deposited reach only thermal energies, which are about a factor of 50 to 100 lower than the kinetic energies of the particles created with a sputter procedure. Therefore, the MOCVD method ensures that a penetration of the particles that form the transparent electrode does not occur in the molecular structure of the porphyrin during the process of precipitation, when a metal cation is situated in the porphyrin center.

Furthermore, using MOCVD, it is also possible to fill the central place in the molecular structure of the porphyrin if for instance, this central place were vacant or chemically very damaged. In both cases, the memory function of the porphyrin derivative will be improved. The preliminary metal precursors, which could be used in one of the above mentioned MOCVD processes according to the invention, are for instance diethyl zinc in the presence of water.

Furthermore, doping molecules like boron in the form of diboran, Al in the form of trimethylaluminum or gallium in the form of trimethylgallium, or Mg in the form of diethylmagnesium can also be present.

The MOCVD process as described above is preferably carried out at a pressure of about 0.5 mbar and a temperature within the range of about 150-200° C., preferably at about 180° C. The process can be integrated in a roll-to-roll procedure.

In accordance with the invention, the memory cell can, for instance, be integrated in a cross point array.

To this effect the bottom electrode or a plurality of bottom electrodes is deposited and structured on a substrate made of polymers, for instance, by way of thermal evaporation of silicon, aluminum, titan, gold, silver, platinum or palladium. Subsequently, a self-assembled mono layer of a metal porphyrin derivative is formed, as described above.

The fabrication of a transparent electrode or a conductive path is carried out through the MOCVD method, e.g. by using a shadow mask.

After the active layer has been deposited on the bottom electrode, the top electrode can be formed as described above.

In a preferred embodiment of the invention, a plurality of upper electrodes is arranged transverse to the plurality of lower electrodes. This generates at each crossing point of the upper electrode and the lower electrode a so-called crossing point cell which includes at least three layers, namely, the lower electrode, the active material, and the upper electrode.

A memory element which also forms part of the present invention can comprise several of the memory cells described above. In a preferred embodiment of the invention, the memory element comprises several mutually crossing word and bit lines such that the cells reside at the crossing points of the word and bit lines ("crossing point" cell). In this case, the storage cells are arranged in the semiconductor molecular hybrid element as a matrix, whereby this matrix extends both in the XY plane and in the XZ plane.

The arrangement of several cells in one matrix corresponds to the arrangement of ferroelectric or ferromagnetic storage devices and is know to those skilled in the art. The crossing point cells can be manufactured either by depositing the monolayer on the bottom electrode directly after the structuring of the bottom electrode or by first structuring the bottom electrode, then depositing a dielectric layer (field dielectric) on the bottom electrode, and defining contact holes in which the storage material (the organic compound) is deposited. Subsequently, the counter-electrode (top electrode) is defined orthogonal to the bottom electrode.

The possibilities of arranging the storage cells are described for example in DE 103 55 561.7. During the fabrication of the storage cells according to the invention, it is necessary to ensure only that the thickness of the field dielectric is approximately equal to the length of the molecules forming the self-organizing monolayer. The cell structure is particularly well-suited for the fabrication of staggered arrays.

According to the invention the porphyrin derivatives can also be filled into a hole (via concept), which was opened over the first electrode. The second electrode can be then deposited and structured as described above.

The basic principles underlying both concepts, namely the cross point concept and the "via concept," are known to those skilled in the art and can be applied to make highly integrated arrays of the memory cells according to the present invention.

The invention claimed is:

1. A memory cell for opto-electronic applications, comprising:
   a substrate;
   a first electrode and a second electrode; and
   an active layer disposed between the first and the second electrodes, wherein the active layer includes a Zn-porphyrin derivative, and wherein the second electrode is transparent and comprises ZnO doped with one of the elements selected from the group consisting of boron, aluminum, gallium, and magnesium;
   wherein the memory cell is disposed in a memory element comprising a memory cell field, and the memory cell field is formed as a cross point array.

2. The memory cell according to claim 1, wherein the dopant concentration is in the range of about 1-1.5 Atom %.

3. The memory cell according to claim 1, wherein the substrate comprises a polymer.

4. The memory cell according to claim 1, wherein the first electrode comprises polysilicon, Si/SiO2 or Au.

5. The memory cell according to claim 1, wherein the memory cell is arranged in a memory element comprising a memory cell field, and the memory cell is in the via contact hole between the first and second electrodes.

6. The memory cell according to claim 1, wherein the second transparent electrode is deposited by an MOCVD method.

7. The memory cell according to claim 6, wherein a precursor for zinc used in the MOCVD-process is diethyl zinc, which is used in the presence of $H_2O$.

8. The memory cell according to claim 1, whereas diboran is used as a boron source during the manufacturing of the second transparent electrode.

9. The memory cell according to claim 1, wherein trimethylaluminum is used as an aluminum source during the manufacturing of the second transparent electrode.

10. The memory cell according to claim 1, wherein trimethyl gallium is used as a gallium source during the manufacturing of the second transparent electrode.

11. The memory cell according to claim 6, wherein the MOCVD procedure is carried out at a pressure of about 0.5 mbar.

12. The memory cell according to claim 6, wherein the MOCVD procedure is carried out at a temperature of about 180° C.

13. The memory cell according to claim 1, wherein the cell is manufactured by a roll-to-roll procedure.

14. A memory cell for opto-electronic applications, comprising:
   a substrate;
   a first electrode and a second electrode; and
   an active layer disposed between the first and the second electrodes, wherein the active layer includes a Zn-porphyrin derivative, and wherein the second electrode is transparent and comprises ZnO doped with one of the elements selected from the group consisting of boron, aluminum, gallium, and magnesium;
   wherein the memory cell is arranged in a memory element comprising a memory cell field, and the memory cell is in the via contact hole between the first and second electrodes.

* * * * *